US011081463B2

United States Patent
Fournel et al.

(10) Patent No.: US 11,081,463 B2
(45) Date of Patent: Aug. 3, 2021

(54) BONDING METHOD WITH ELECTRON-STIMULATED DESORPTION

(71) Applicant: COMMISSARIAT À L'ÉNERGIE ATOMIQUE ET AUX ÉNERGIES ALTERNATIVES, Paris (FR)

(72) Inventors: Frank Fournel, Grenoble (FR); Vincent Larrey, Grenoble (FR); Sylvain Maitrejean, Grenoble (FR); Christophe Morales, Grenoble (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 24 days.

(21) Appl. No.: 16/671,352

(22) Filed: Nov. 1, 2019

(65) Prior Publication Data

US 2020/0152597 A1   May 14, 2020

(30) Foreign Application Priority Data

Nov. 9, 2018   (FR) ...................... 1860395

(51) Int. Cl.
*H01L 23/00* (2006.01)
*H01L 21/18* (2006.01)

(52) U.S. Cl.
CPC ............ *H01L 24/80* (2013.01); *H01L 21/187* (2013.01); *H01L 2224/80011* (2013.01); *H01L 2224/80031* (2013.01); *H01L 2224/80099* (2013.01); *H01L 2224/80201* (2013.01); *H01L 2224/80894* (2013.01)

(58) Field of Classification Search
CPC ....... H01L 21/187; H01L 2224/80894–80896; H01L 2224/81894–81896; H01L 2224/82895–82897; H01L 2224/83894–83896; H01L 2224/0812–08268; H01L 2224/80099; H01L 21/3003–3006; H01L 2224/8001–80019
See application file for complete search history.

(56) References Cited

U.S. PATENT DOCUMENTS

| | | |
|---|---|---|
| 2003/0141502 A1 | 7/2003 | Tong |
| 2007/0117258 A1 | 5/2007 | Moriceau et al. |
| 2009/0162991 A1 | 6/2009 | Beneyton et al. |
| 2012/0088352 A1 | 4/2012 | Beneyton et al. |
| 2013/0075365 A1 | 3/2013 | Fournel et al. |
| 2013/0175643 A1 | 7/2013 | Berthelot et al. |
| 2013/0181302 A1 | 7/2013 | Giroud et al. |
| 2013/0187276 A1 | 7/2013 | Ernst et al. |
| 2014/0014618 A1 | 1/2014 | Fournel et al. |
| 2014/0295606 A1 | 10/2014 | Larrey et al. |
| 2015/0179474 A1 | 6/2015 | Maitrejean et al. |
| 2015/0179665 A1 | 6/2015 | Reboh et al. |
| 2016/0005862 A1 | 1/2016 | Reboh et al. |
| 2016/0071933 A1 | 3/2016 | Maitrejean et al. |
| 2016/0254362 A1 | 9/2016 | Maitrejean et al. |
| 2017/0076944 A1 | 3/2017 | Augendre et al. |
| 2017/0141212 A1 | 5/2017 | Barraud et al. |
| 2017/0263495 A1 | 9/2017 | Augendre et al. |
| 2017/0263607 A1 | 9/2017 | Maitrejean et al. |
| 2018/0158719 A1 | 6/2018 | Fournel et al. |
| 2018/0218997 A1 | 8/2018 | Fournel et al. |
| 2018/0358261 A1 | 12/2018 | Beche et al. |

OTHER PUBLICATIONS

Search Report for French Application No. FR1860395 dated May 2, 2019.
Takagi, H. et al. "Surface activated bonding of silicon wafers at room temperature" IN: Applied Physics Letters, Apr. 15, 1996, vol. 68, No. 16, pp. 2222-2224.
Specification and drawings for U.S. Appl. No. 16/578,737 entitled "Substrate Stripping Method by Transfer of a Thermoplastic Polymer Surface Film", filed Sep. 23, 2019.
Specification and drawings for U.S. Appl. No. 16/570,296 entitled "Temporary Bonding Method with Thermoplastic Adhesive Incorporating a Rigid Ring", filed Sep. 13, 2019.

*Primary Examiner* — Amar Movva
(74) *Attorney, Agent, or Firm* — Pearne & Gordon LLP

(57) ABSTRACT

A method for directly bonding a first and a second substrate. The method comprises removing surface oxide layers from bonding faces of the first and of the second substrate, and hydrogen passivation of the bonding faces, then, in a vacuum, electron impact hydrogen desorption on the bonding faces followed by placement of the bonding faces in intimate contact with one another.

10 Claims, No Drawings

BONDING METHOD WITH ELECTRON-STIMULATED DESORPTION

CROSS-REFERENCE TO RELATED APPLICATIONS

This application claims priority from French Patent Application No. 18 60395 filed on Nov. 9, 2018. The content of this application is incorporated herein by reference in its entirety.

TECHNICAL FIELD

The field of the invention is that of the direct bonding of substrates. The invention more particularly relates to direct bonding capable of being obtained at ambient temperature and not requiring post-bonding annealing in order to increase the bonding energy.

PRIOR ART

The direct bonding technique consists of placing sufficiently clean and smooth surfaces in intimate contact with one another so that adhesion therebetween can take place. Substrates can thus be assembled without the provision of additional material, and in particular without adhesive.

Although numerous surface preparation and bonding techniques exist in the field of direct bonding, generally speaking an annealing step is always required after the bonding step at ambient temperature, in order to increase the adhesion energy of the surfaces placed in contact with one another.

However, the surface activated bonding technique (known as SAB), allows an adhesion energy to be obtained at a temperature as low as ambient temperature. This technique consists of bombarding the surfaces to be bonded by ions, for example argon ions, under a high vacuum. Ion bombardment allows the surface oxide to be removed as well as the organic contaminants. The high vacuum prevents the surface oxide from reforming.

This technique works very well with semi-conductive materials such as silicon or germanium, since ion bombardment allows the surface contaminants and native oxide to be removed, while leaving dangling bonds at the surface, which enable a very high adhesion to be obtained without thermal annealing. However, as a result of the activation, argon ions are implanted in the surface and damage the crystal lattice which leads to superficial amorphization.

In order to reduce the amorphous layer generated by the activation, it has been proposed to use atoms that are smaller than argon, such as helium. However, the stripping of the surface to obtain the dangling bonds thus becomes less effective. The current tendency is to use atoms that are heavier than argon, such as neon for example, or even to use atom clusters for the GCIB (Gas Cluster Ion Beam) technique. However, the aforementioned technique does not enable a large surface to be treated, such as that of a substrate having a diameter of 200 mm, within a reasonable period of time.

DESCRIPTION OF THE INVENTION

The purpose of the invention is to propose a direct bonding technique which, similarly to SAB, does not require post-bonding reinforcing annealing and which, unlike SAB, does not lead to the formation of an amorphous layer.

For this purpose, the invention proposes a method for directly bonding a first and a second substrate, comprising:
  removal of surface oxide layers from bonding faces of the first and of the second substrate;
  hydrogen passivation of the bonding faces; and
  in a vacuum, electron impact hydrogen desorption on the bonding faces followed by placement of the bonding faces in intimate contact with one another.

Some preferred, however non-limiting aspects of this method are as follows:
  the removal step is carried out chemically;
  the removal and passivation steps are carried out simultaneously;
  the removal and passivation steps are carried out using a solution of hydrofluoric acid;
  during the electron impact hydrogen desorption step, each of the first and second substrates is arranged on an electrically conducting support;
  an electrical contact connects the bonding face of one of the first and second substrates to the support thereof;
  the electron impact produces an impact of $10^{14}$ to $10^{19}$ electrons/cm$^2$;
  the energy of the electron impact lies in the range 0.01 to 100 kEv and the intensity thereof lies in the range 0.01 to 1,000 µA/cm$^2$;
  the electron impact step on one of the bonding faces comprises sweeping by an electron beam so as to irradiate the entire bonding face a plurality of times;
  the bonding faces placed in intimate contact with one another are maintained under pressure.

Other aspects, purposes, advantages and features of the invention will be better understood upon reading the following detailed description given of the non-limiting preferred embodiments of the invention, provided for illustration purposes.

DETAILED DESCRIPTION OF SPECIFIC EMBODIMENTS

The invention relates to a method for directly bonding a first and a second substrate. The substrates can be made of a semi-conductive material, for example silicon or germanium.

The method according to the invention preferably comprises a prior step of cleaning the first and second substrates in order to remove any potential organic or particulate contaminations.

This method comprises removing surface oxide layers from bonding faces of the first and of the second substrate, and hydrogen passivation of the bonding faces, each whereof has been stripped of the respective oxide layer thereof. The removal step can be carried out chemically. The removal and passivation steps can be carried out simultaneously, for example using a solution of hydrofluoric acid. Alternatively, the removal and passivation steps can be carried out sequentially, for example by performing the removal step by high-temperature annealing (generally at more than 700° C.) under an ultra-high vacuum and by performing passivation with hydrogen partial pressure (generally at more than 0.01 mbar).

After removal and passivation, each of the substrates is placed in a desorption chamber of a vacuum enclosure, generally at less than $10^{-6}$ mbar and preferably at less than $10^{-8}$ mbar. The method is continued by carrying out, in each of the desorption chambers, electron impact hydrogen desorption on the bonding face of a substrate. The bonding face of each of the substrates is thus subjected to electron bombardment according to the so-called ESD (Electron Stimulated Desorption) technique, in order to remove the hydrogen atoms and leave dangling bonds allowing for a subsequent high-energy bonding.

During the electron impact hydrogen desorption step, each of the first and second substrates can be arranged on an electrically conducting support. In this way, charge problems that may arise during the treatment of a surface having a large surface area since the electrons cannot be neutralised, can be resolved. In one possible embodiment, which is advantageously applied for substrates of the SeOI (Semiconductor On Insulator) type, an electrical contact connects the bonding face of a substrate to the support thereof.

During electron impact hydrogen desorption on a bonding face, an electron beam can bombard the bonding face in order to reach a bombardment dose of $10^{14}$ to $10^{19}$ electrons/$cm^2$, preferably $10^{14}$ to $10^{18}$ electrons/$cm^2$. The energy of the electrons can lie in the range 0.01 to 100 kEv, preferably 0.1 to 10 keV, and the intensity thereof can lie in the range 0.01 to 1,000 $\mu A/cm^2$, preferably 1 to 100 $\mu A/cm^2$. If the beam is not wide enough to cover all of the bonding face, it is swept such that the electron impact covers the entirety of the bonding face. If required in order to reach the dose of interest, sweeping by the electron beam is carried out so as to irradiate the entire bonding face a plurality of times. For the purposes of illustration, the dose of interest can be reached in less than 5 minutes.

After the ESD treatment of the bonding face of each of the substrates, the substrates are transferred to a bonding chamber inside the vacuum enclosure. The method then comprises the placement of the bonding faces in intimate contact with one another. The bonding faces placed in intimate contact with one another are preferably maintained under pressure, for example at a pressure ranging from 0.01 to 5 MPa, preferably at a pressure ranging from 0.1 to 1 MPa, and for a duration that generally lies in the range 5 seconds to 60 minutes, preferentially 1 minute. The assembly formed by the two substrates bonded by way of the bonding faces is then removed from the vacuum chamber.

One example method of implementing the method according to the invention is as follows. Two silicon substrates, of orientation <001>, measuring 200 mm in diameter, 725 μm in thickness and having a resistivity of 10 ohm/cm are cleaned using a solution of deionised water to which is added 30 ppm ozone, followed by cleaning using an SC1 ("Standard Clean 1") solution composed of a deionised water, ammonia and hydrogen peroxide base in the proportions 5:1:1. The substrates are subjected to deoxidation with a solution having a HF 1% base which causes hydrogen passivation of the bonding faces. After rinsing with deionised water and drying, each of the two substrates is placed in a chamber under an ultra-high vacuum at $10^{-8}$ mbar, where they are each arranged on an earthed conductive substrate holder.

A 1 $cm^2$ electron beam sweeps the surface of each of the substrates at a speed of 10 cm per second. The entire surface is swept in approximately 40 seconds. The energy of the electron beam is 10 kEv and the intensity thereof is 200 μA. By sweeping the surface of each of the substrates 10 times, a dose of approximately $10^{15}$ electrons/$cm^2$ is obtained. After the ESD treatment of the two substrates carried out simultaneously in the two chambers, the substrates are transferred to a bonding chamber. The two treated faces are placed facing one another and are brought into contact with one another. A force of 0.2 MPa is applied for 1 minute. The assembly generated by the bonding is then removed from the ultra-high vacuum chamber.

The invention claimed is:

1. A method for directly bonding a first substrate having a first bonding face and a second substrate having a second bonding face, comprising the steps of:
    removing a surface oxide layer from each of the first and second bonding faces;
    hydrogen passivating each of the first and second bonding faces; and
    in a vacuum, performing electron impact hydrogen desorption on the each of the first and second bonding faces followed by placing the first and second bonding faces in intimate contact with one another.

2. The method according to claim 1, wherein the step of removing is carried out chemically.

3. The method according to claim 2, wherein the steps of removing and of hydrogen passivating are carried out simultaneously.

4. The method according to claim 3, wherein the steps of removing and of hydrogen passivating are carried out using a solution of hydrofluoric acid.

5. The method according to claim 1, wherein during the step of performing electron impact hydrogen desorption, each of the first and second substrates is arranged on an electrically conducting support.

6. The method according to claim 5, wherein an electrical contact connects the first or second bonding face to the support on which is respectively arranged the first or second substrate.

7. The method according to claim 1, wherein the step of performing electron impact hydrogen desorption is made so as to produce an impact of $10^{14}$ to $10^{19}$ electrons/$cm^2$.

8. The method according to claim 7, wherein the step of performing electron impact hydrogen desorption is made with an energy of the electron impact which lies in the range 0.01 to 100 kEv and with an intensity which lies in the range 0.01 to 1,000 $\mu A/cm^2$.

9. The method according to claim 1, wherein the step of performing electron impact hydrogen desorption on one of the first and second bonding faces comprises sweeping by an electron beam so as to irradiate the entire one of the first or second bonding face a plurality of times.

10. The method according to claim 1, further comprising the step of maintaining under pressure the first and second bonding faces placed in intimate contact with one another.

* * * * *